(12) United States Patent
Han

(10) Patent No.: US 11,563,172 B2
(45) Date of Patent: Jan. 24, 2023

(54) VARIABLE RESISTANCE MEMORY DEVICE AND MANUFACTURING METHOD OF THE SAME

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/211,764

(22) Filed: Mar. 24, 2021

(65) Prior Publication Data
US 2022/0102628 A1    Mar. 31, 2022

(30) Foreign Application Priority Data
Sep. 25, 2020 (KR) .......................... 10-2020-0124963

(51) Int. Cl.
*H01L 45/00* (2006.01)
*H01L 27/24* (2006.01)

(52) U.S. Cl.
CPC .......... *H01L 45/08* (2013.01); *H01L 27/2463* (2013.01); *H01L 45/1233* (2013.01); *H01L 45/1246* (2013.01); *H01L 45/1253* (2013.01); *H01L 45/146* (2013.01); *H01L 45/16* (2013.01)

(58) Field of Classification Search
CPC . H01L 45/08; H01L 27/2463; H01L 45/1233; H01L 45/1246; H01L 45/1253; H01L 45/146
See application file for complete search history.

(56) References Cited

U.S. PATENT DOCUMENTS

| | | | |
|---|---|---|---|
| 2008/0079029 A1* | 4/2008 | Williams | H01L 45/14 257/213 |
| 2009/0303773 A1 | 12/2009 | Rinerson et al. | |
| 2014/0301127 A1* | 10/2014 | Kim | G11C 13/0007 257/4 |
| 2018/0138401 A1 | 5/2018 | Ando et al. | |
| 2020/0006431 A1* | 1/2020 | Mayuzumi | H01L 43/12 |
| 2020/0006646 A1 | 1/2020 | Cheng | |

FOREIGN PATENT DOCUMENTS

| KR | 10-1133707 B1 | 3/2011 |
| KR | 10-2013-0052371 A1 | 5/2013 |
| KR | 10-2014375 B1 | 10/2014 |

* cited by examiner

*Primary Examiner* — Shih Tsun A Chou

(57) ABSTRACT

There are provided a variable resistance memory device and a manufacturing method of the same. The variable resistance memory device includes: a first electrode; a second electrode arranged in a vertical direction from the first electrode; and an oxide layer having an oxygen deficient region extending in the vertical direction between the second electrode and the first electrode.

12 Claims, 30 Drawing Sheets

VARIABLE RESISTANCE MEMORY DEVICE AND MANUFACTURING METHOD OF THE SAME

CROSS-REFERENCE TO RELATED APPLICATION

The present application claims priority under 35 U.S.C. § 119(a) to Korean patent application number 10-2020-0124963, filed on Sep. 25, 2020, in the Korean Intellectual Property Office, the entire disclosure of which is incorporated herein by reference.

BACKGROUND

1. Technical Field

The present disclosure generally relates to a memory device, and more particularly, to a variable resistance memory device and a method of manufacturing the same.

2. Related Art

Requirements of high-performance and high-capacity memory devices have rapidly increased. Accordingly, it is necessary to develop a next-generation memory device that is advantageous in high integration and that can operate with low power consumption.

A variable resistance memory device may be configured in a Metal-Insulator-Metal (MIM) structure. The variable memory device may include a variable resistance layer. The variable resistance layer is disposed between electrodes. The variable resistance layer may be formed of various materials of which a resistance state can be changed depending on a voltage applied to the electrodes.

A Resistive Random Access Memory (ReRAM) as a variable resistance memory device may control the formation and disappearance of a conductive filament (CF) in an insulator. Accordingly, the ReRAM can be changed between a high resistance state (HRS) and a low resistance state (LRS). The CF may be formed through an electroforming process of inducing a soft breakdown phenomenon in the insulator. Because it is difficult to uniformly control the formation and breaking down of the CF, the operational stability may deteriorate in a variable resistance memory device that uses an electroforming process.

SUMMARY

In accordance with an aspect of the present disclosure, there is provided a variable resistance memory device including: a first electrode; a second electrode arranged in a vertical direction from the first electrode; and a memory cell disposed between the first electrode and the second electrode, the memory cell having a varying resistance according to a distribution density of oxygen vacancies in the memory cell, wherein the memory cell includes an oxide layer having a first oxygen deficient region extending in the vertical direction between the second electrode and the first electrode, and wherein the distribution density of oxygen vacancies in the memory cell is disposed in the first oxygen deficient region.

In accordance with another aspect of the present disclosure, there is provided a method of manufacturing a variable resistance memory device, the method including: forming a first electrode; forming a first layer on the first electrode, wherein the first layer extends in a vertical direction intersecting a surface of the first electrode; forming a second layer on a sidewall of the first layer, wherein the second layer has an oxygen affinity different from that of the first layer and extends in the vertical direction; forming an oxide layer including an oxygen deficient region through an oxidation-reduction reaction occurring at an interface between the first layer and the second layer; and forming a second electrode on the oxide layer to overlap with the first oxygen deficient region in the vertical direction.

BRIEF DESCRIPTION OF THE DRAWINGS

Examples of embodiments will now be described hereinafter with reference to the accompanying drawings; however, concepts disclosed herein may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

DISCLOSURE

Figure 11A:
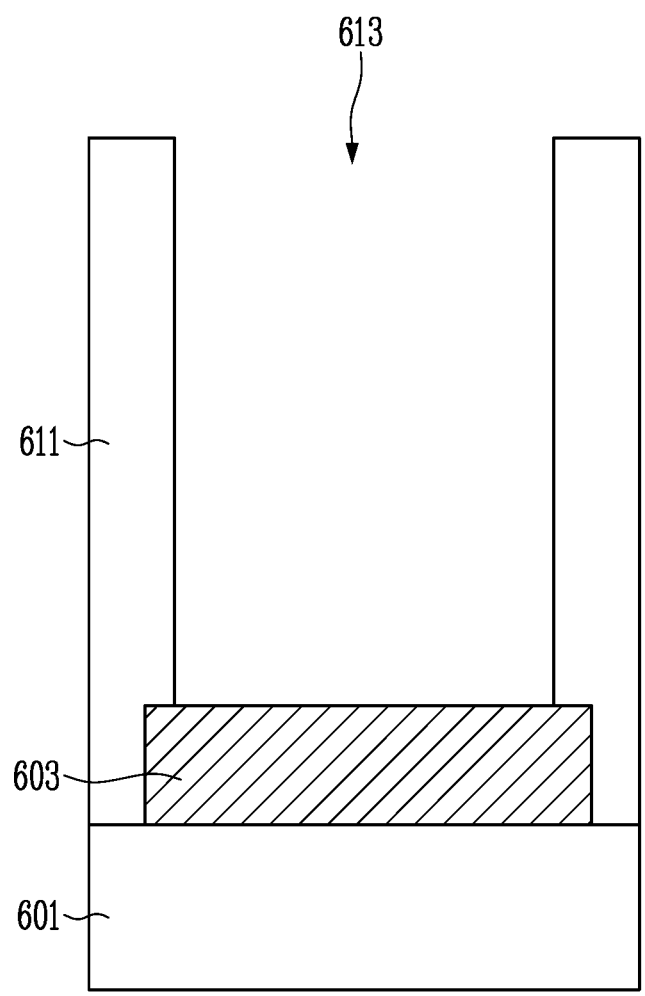
FIGS. 11A to 11D are sectional views illustrating a method of forming a memory cell in accordance with an embodiment of the present disclosure.
Figure 11B:
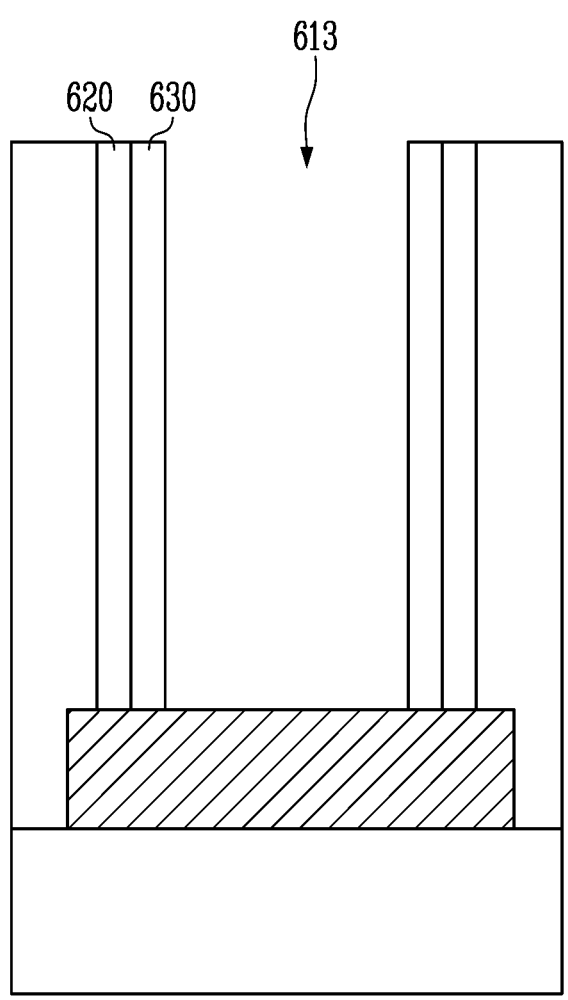
Figure 11C:
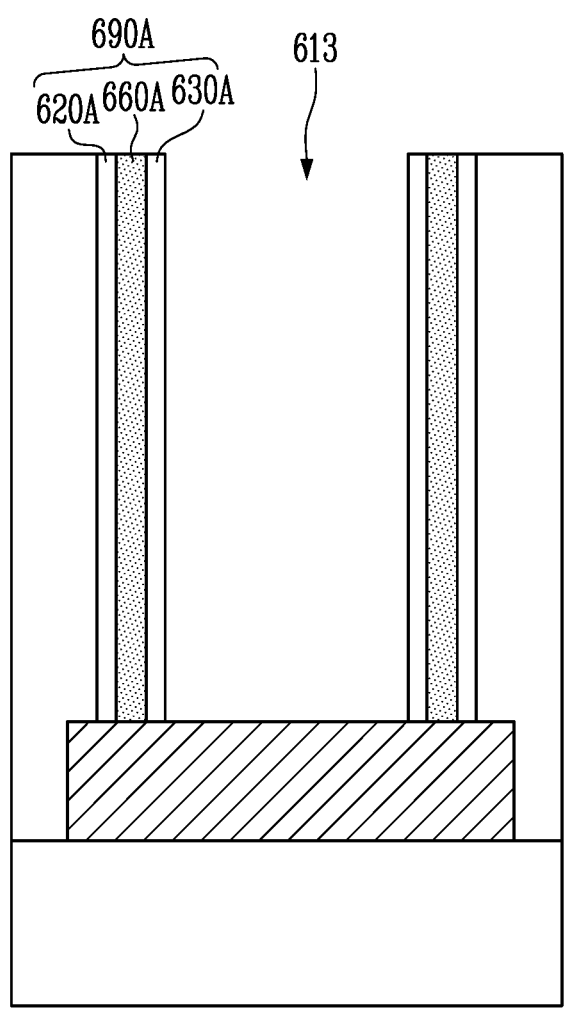
Figure 11D:
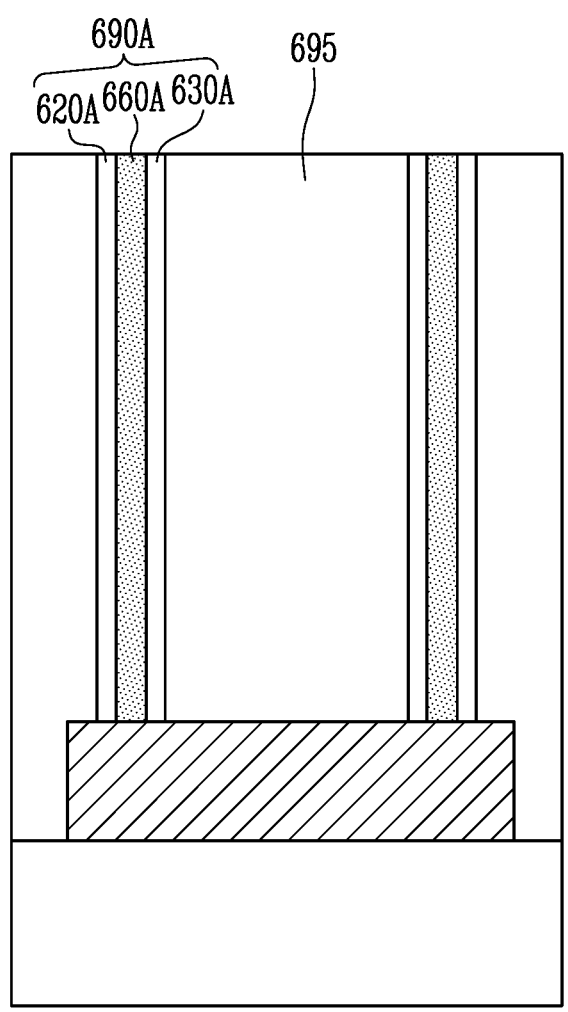
Figure 12:
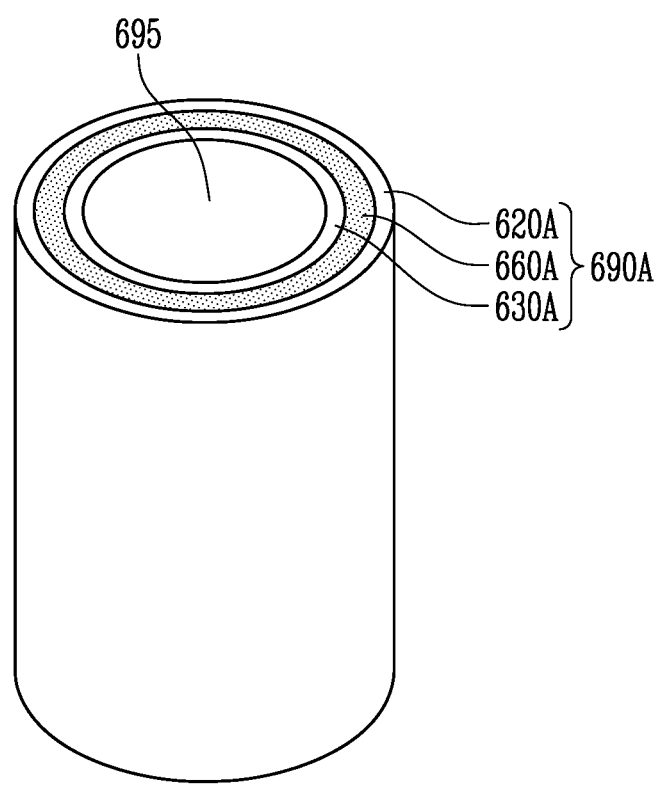

FIG. 12 is a perspective view illustrating a memory cell shown in FIG. 11D.

Figure 13A:
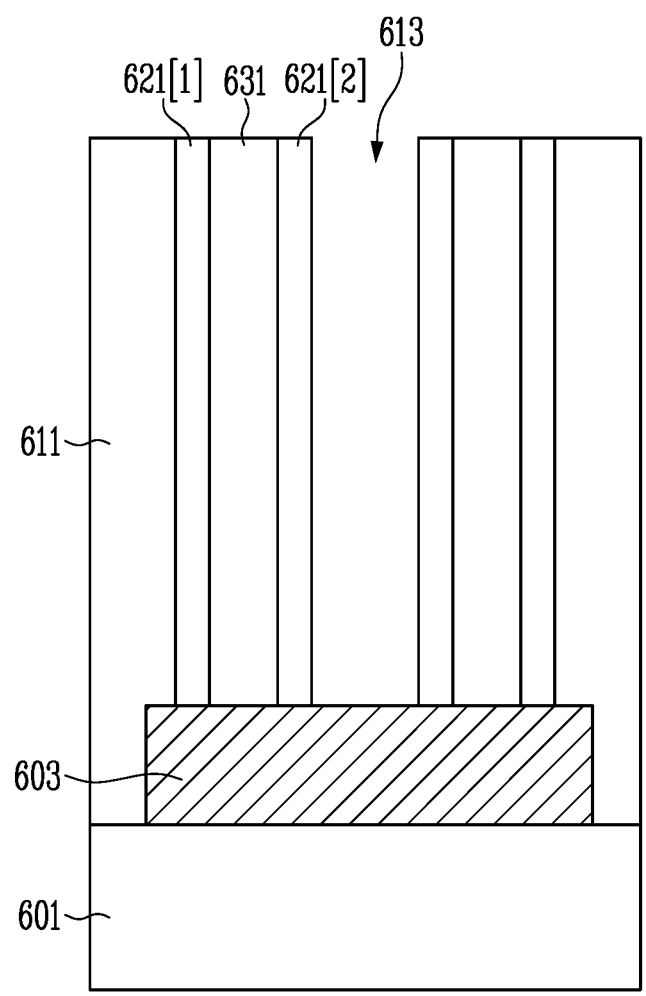
Figure 13B:
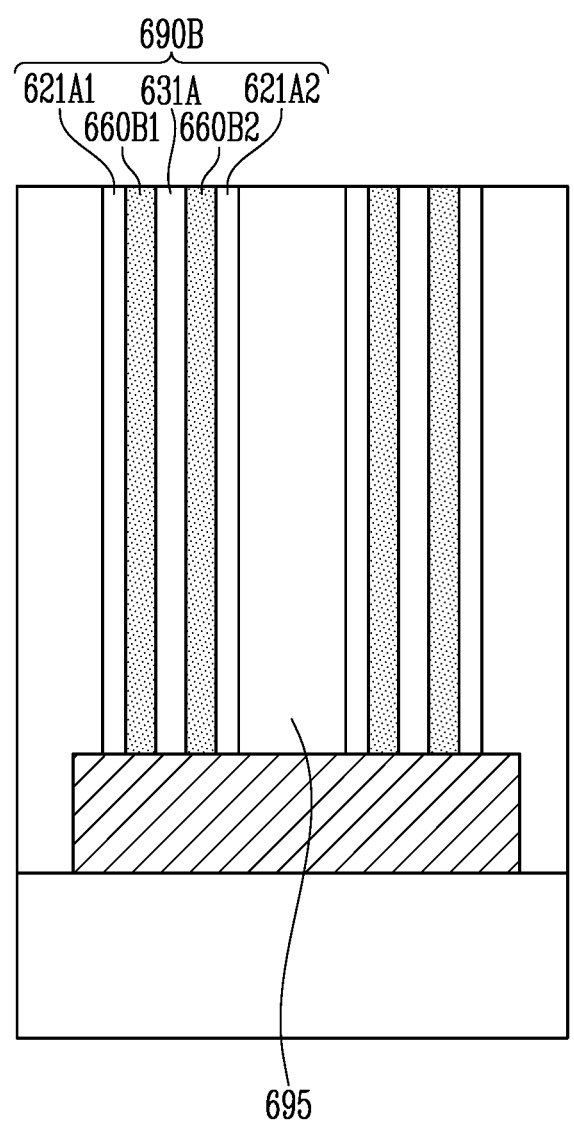

FIGS. 13A and 13B are sectional views illustrating a method of forming a memory cell in accordance with an embodiment of the present disclosure.

Figure 14:
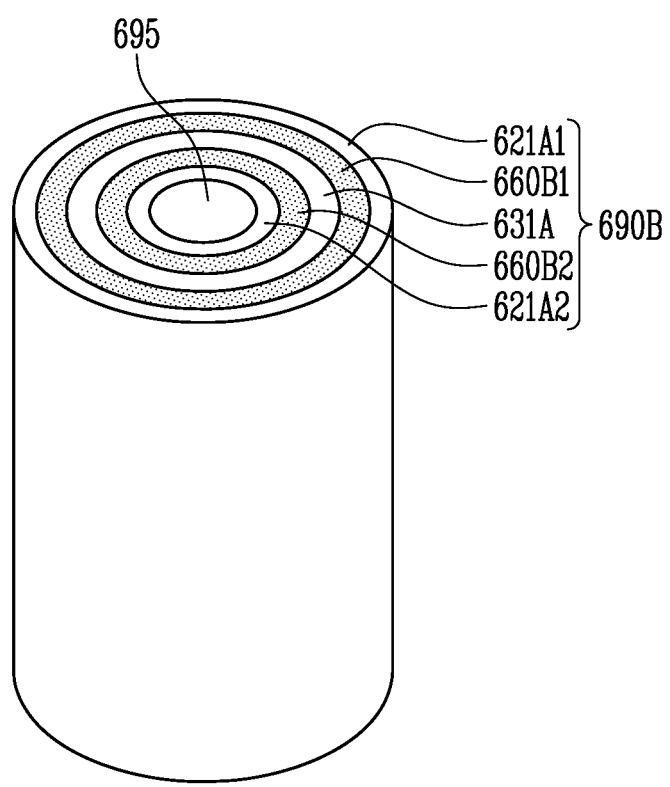

FIG. 14 is a perspective view illustrating a memory cell shown in FIG. 13B.

Figure 15A:
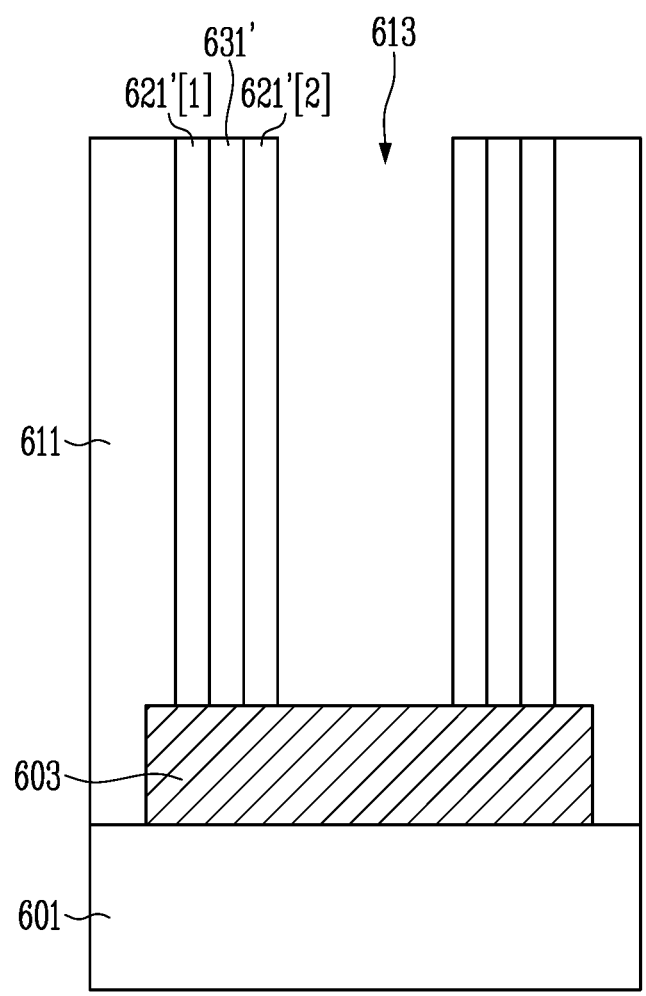
Figure 15B:
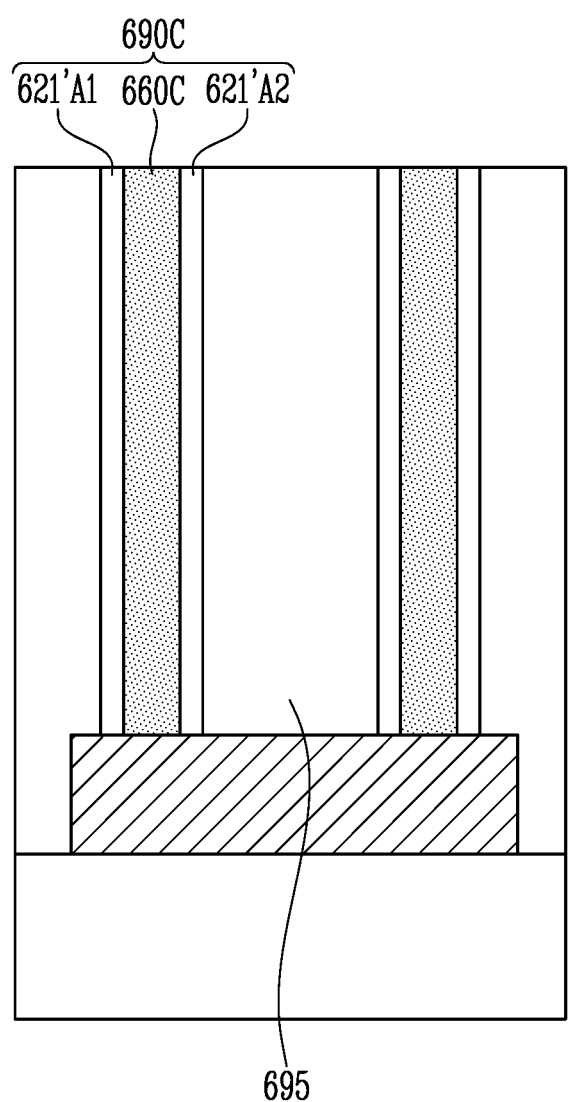

FIGS. 15A and 15B are sectional views illustrating a method of forming a memory cell in accordance with an embodiment of the present disclosure.

Figure 16:
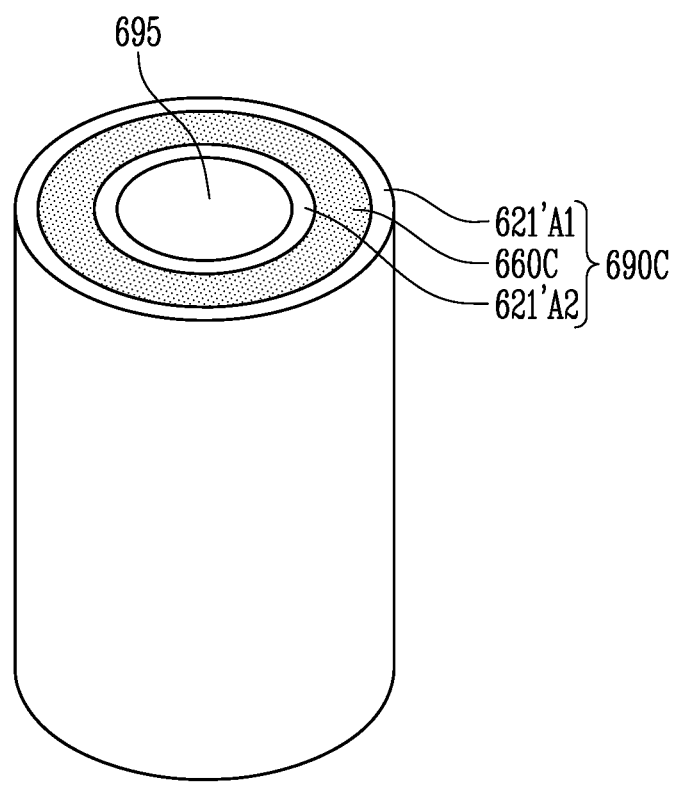

FIG. 16 is a perspective view illustrating a memory cell shown in FIG. 15B.

Figure 17:
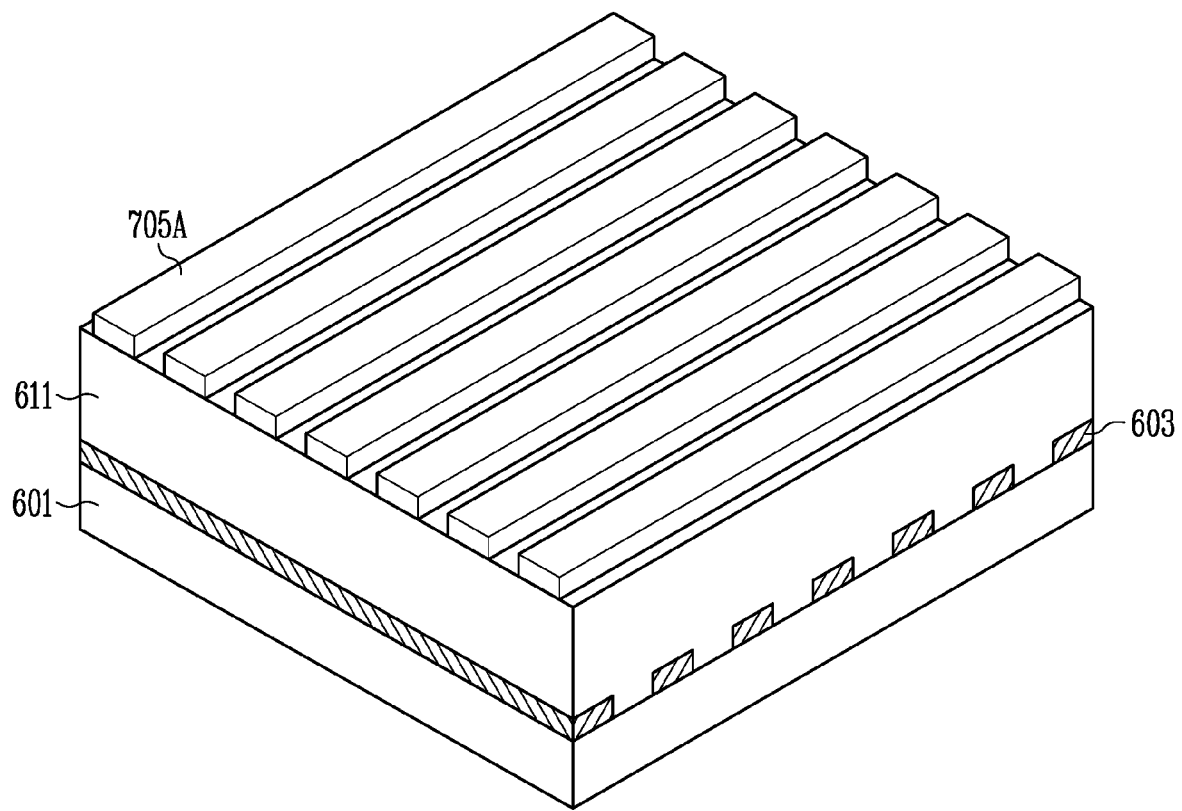
Figure 18:
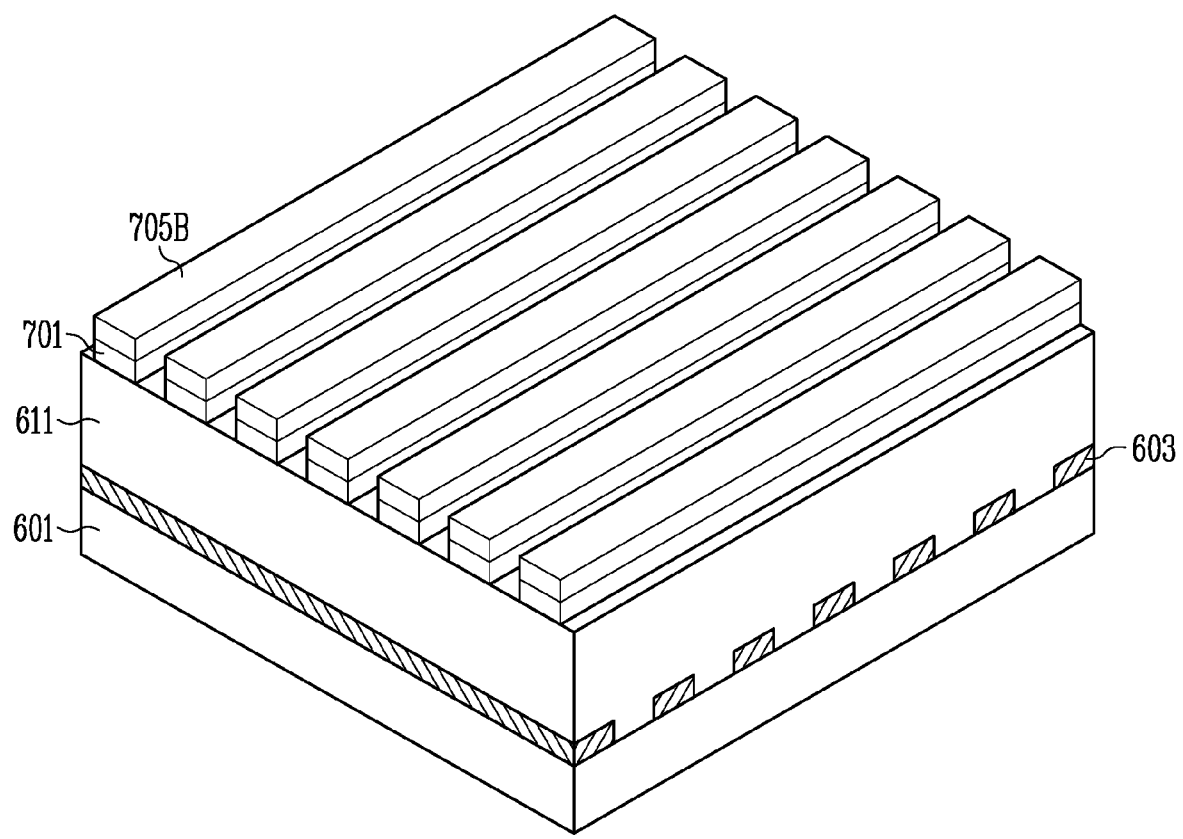

FIGS. 17 and 18 are views illustrating processes performed after a memory cell is formed according to embodiments of the disclosure.

Figure 19:
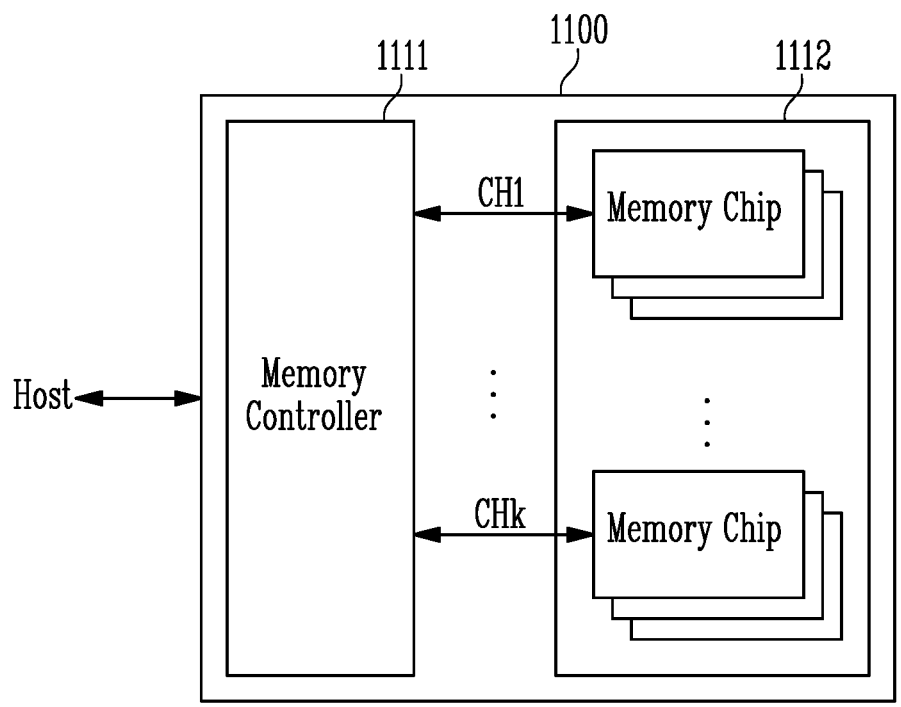

FIG. 19 is a block diagram illustrating a configuration of a memory system in accordance with an embodiment of the present disclosure.

Figure 20:
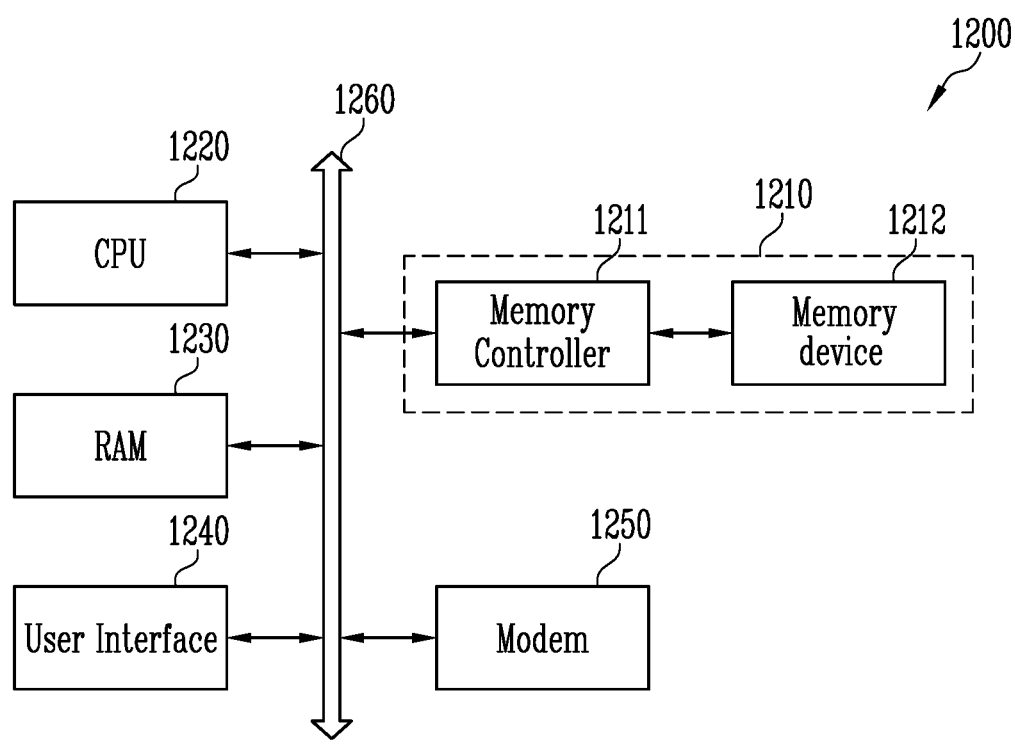

FIG. 20 is a block diagram illustrating a configuration of a computing system in accordance with an embodiment of the present disclosure.

DETAILED DESCRIPTION

The specific structural or functional descriptions disclosed herein are merely illustrative for the purpose of describing embodiments according to the concepts of the present disclosure. Embodiments according to the concepts of the present disclosure can be implemented in various forms and should not be construed as limited to the specific embodiments set forth herein.

Hereinafter, the terms 'first' and 'second' are used to distinguish one component from another component. As such, the components should not be limited by these terms.

Embodiments provide a variable resistance memory device capable of improving operational stability and a method of manufacturing the memory device.

Figure 1A:
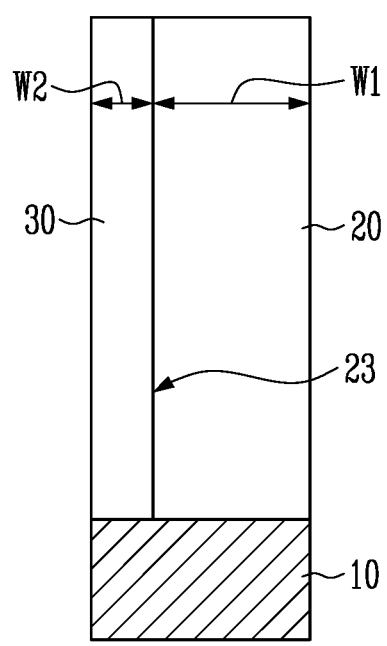
FIGS. 1A and 1B are sectional views schematically illustrating a method of manufacturing a variable resistance memory device in accordance with an embodiment of the present disclosure.
Figure 1B:
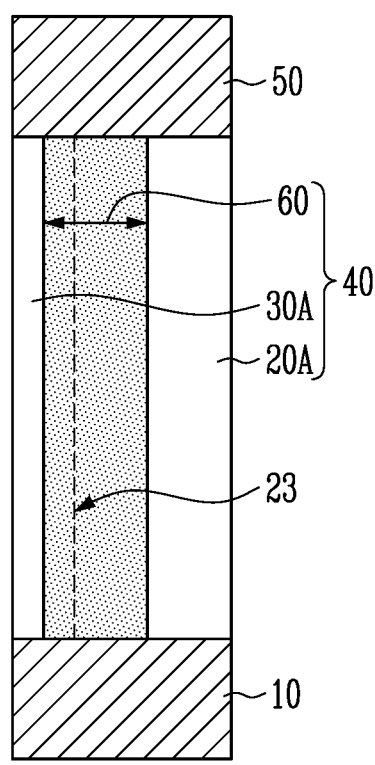

FIGS. 1A and 1B are sectional views schematically illustrating a manufacturing method of a variable resistance memory device in accordance with an embodiment of the present disclosure.

Referring to FIG. 1A, in order to form a variable resistance memory device, a first layer 20 and a second layer 30 may be formed on a first electrode 10. The first layer 20 and the second layer 30 may extend in parallel to each other. More specifically, each of the first layer 20 and the second layer 30 may extend in a vertical direction intersecting a surface of the first electrode 10. The first layer 20 and the second layer 30 may be in contact with each other to define an interface 23.

The first layer 20 and the second layer 30 may be made of materials having different oxygen affinities. In an embodiment, the second layer 30 may be made of a material having an oxygen affinity higher than that of the first layer 20. In an embodiment, the first layer 20 may include a first transition metal oxide. The second layer 30 may include aluminum, silicon or a second transition metal oxide. The second transition metal oxide may include a transition metal having an oxidation rate higher than that of the first transition metal oxide.

When the second layer 30 includes a conductive material such as aluminum or silicon, the second layer 30 may be formed with a narrow width such that the whole of the second layer 30 is easily oxidized in a subsequent oxidation-reduction reaction. In an embodiment, a width W2 of the second layer 30 may be smaller than that W1 of the first layer 20.

Referring to FIG. 1B, an oxidation-reduction reaction may occur due to a difference in oxygen affinity between the first layer 20 and the second layer 30 illustrated in FIG. 1A. In an embodiment, the oxidation-reduction reaction may occur when an atomic layer deposition process forms the second layer 30 on a sidewall of the first layer 20. In another embodiment, annealing may be performed to activate the oxidation-reduction reaction. In still another embodiment, when a certain time elapses after the first layer 20 and the second layer 30 are in contact with each other, the oxidation-reduction reaction may occur such that a thermodynamic equilibrium state is achieved at the interface between the first layer 20 and the second layer 30.

An oxidation thickness of the second layer 30 shown in FIG. 1A may be changed by controlling at least one of a difference in oxygen affinity between the first layer 20 and the second layer 30 and a temperature for the annealing. For example, when the second layer 30 shown in FIG. 1A includes silicon or aluminum, the oxidation-reduction reaction may be controlled such that the whole of the second layer 30 shown in FIG. 1A can be oxidized.

The oxidation-reduction reaction may occur from the interface 23 between the first layer 20 and the second layer 30, which are described with reference to FIG. 1A. Referring to FIG. 1B, an oxide layer 40 including an oxygen deficient region 60 may be formed by the oxidation-reduction reaction. The oxidation deficient region 60 may include oxygen vacancies. The oxygen vacancies may be formed by the oxidation-reduction reaction and may be distributed to extend from the interface 23 on both sides of the interface 23. A density of the oxygen vacancies in the oxygen deficient region 60 may be greater closer to the interface 23, and decrease with distance from the interface 23.

The oxide layer 40 may further include a first region 20A and a second region 30A. The second region 30A may include silicon oxide ($SiO_x$), aluminum oxide ($AlO_x$), or a second transition metal oxide. The oxygen deficient region 60 may be disposed between the first region 20A and the second region 30A.

In an embodiment, the first layer 20 shown in FIG. 1A may be hafnium oxide (HfOx), and the second layer 30 shown in FIG. 1A may be silicon. A mixture (Si:HfOx) of the silicon and the hafnium oxide may be generated by an oxidation-reduction reaction of the silicon and the hafnium oxide. The mixture (Si:HfOx) of the silicon and the hafnium oxide may constitute the oxygen deficient region 60. In addition, the first region 20A may include the remaining hafnium oxide (HfOx), and the second region 30A may include silicon oxide (SiOx). A hafnium concentration may decrease moving towards the interface 23 in the first region 20A, and a silicon concentration may decrease moving closer to the interface 23 from the second region 30A.

After the oxide layer 40 including the oxygen deficient region 60 is formed as described above, a second electrode 50 covering the oxide layer 40 may be formed. The second electrode 50 may be arranged in a vertical direction from the first electrode 10. In accordance with an embodiment of the present disclosure, each of the oxygen deficient region 60, the first region 20A, and the second region 30A of the oxide layer 40 may extend in the vertical direction between the second electrode 50 and the first electrode 10.

As described above, in accordance with embodiments of the present disclosure, because the oxygen vacancies are generated from the interface 23, the oxygen vacancies in the oxygen deficient region 60 are not biased towards any one of the first electrode 10 and the second electrode 50, and so the oxygen vacancies can be uniformly distributed in the vertical direction between the first electrode 10 and the second electrode 50.

Figure 2A:
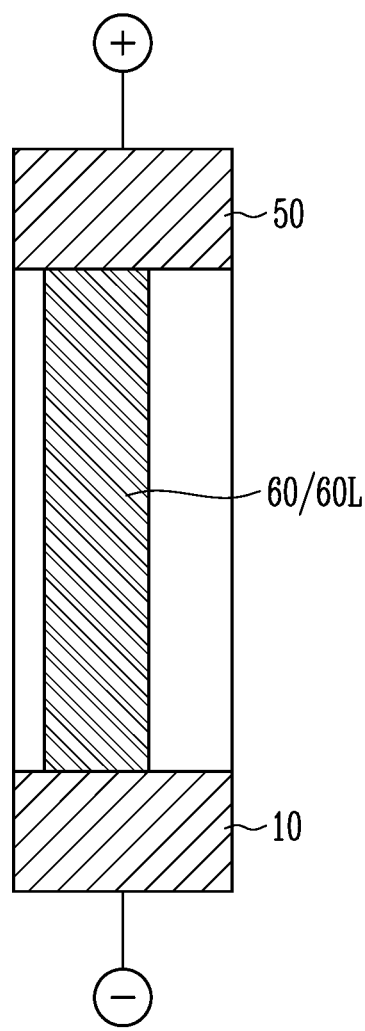
FIGS. 2A and 2B are sectional views schematically illustrating an operation of a variable resistance memory device shown in FIG. 1B.
Figure 2B:
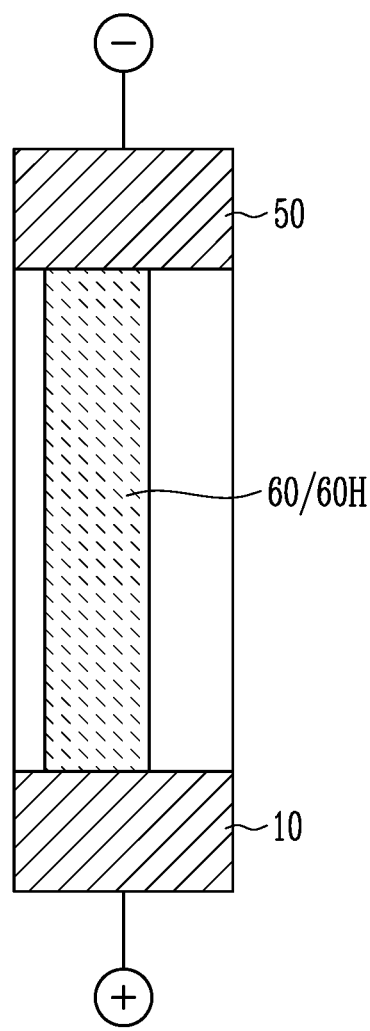

FIGS. 2A and 2B are sectional views schematically illustrating an operation of a variable resistance memory device shown in FIG. 1B.

Referring to FIG. 2A, when an electric field is formed between a first electrode 10 and a second electrode 50, oxygen vacancies may be concentrated in a direction in which the electric field is formed within an oxygen deficient region 60, thereby forming a conductive path that is similar to a conducting filament (CF). An oxygen deficient region 60L having a low resistance state (LRS) may be provided due to such a distribution of the oxygen vacancies. In an embodiment, for a set operation to the low resistance state (LRS) of a variable resistance memory device, a negative (−) voltage may be applied to the first electrode 10, and a positive (+) voltage may be applied to the second electrode 50.

Referring to FIG. 2B, for a reset operation to a high resistance state (HRS) of a variable resistance memory device, an electric field may be formed in a direction that is the reverse from that shown in FIG. 2A. In an embodiment, for the reset operation, a positive (+) voltage is applied to the first electrode 10, and a negative (−) voltage may be applied to the second electrode 50.

When a reverse electric field is formed, a distribution density of the oxygen vacancies may be lowered due to migration of the oxygen vacancies in the oxygen deficient region 60. An oxygen deficient region 60H corresponding to the high resistance state (HRS) may be provided due to such a change in the distribution density of the oxygen vacancies.

Figure 3:
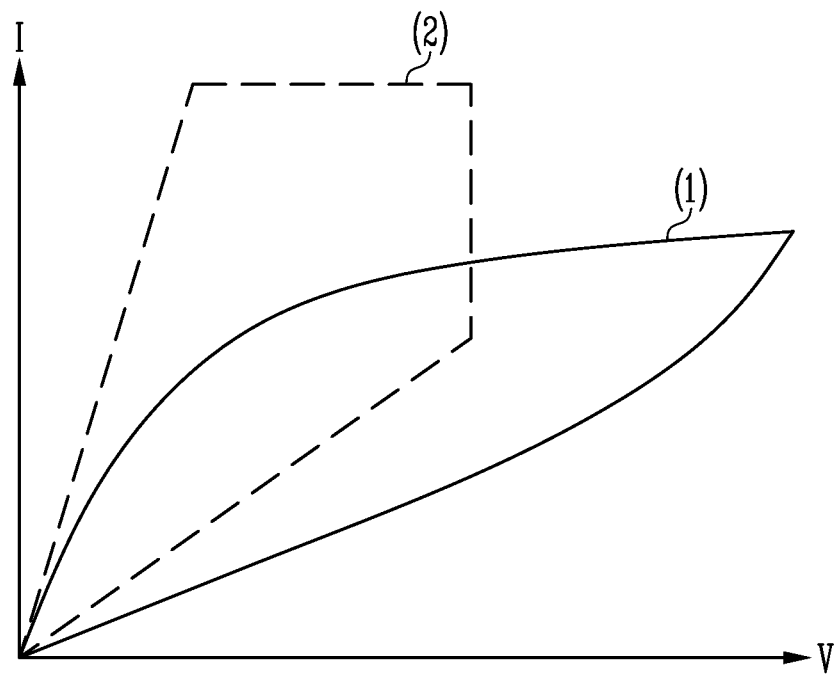
FIG. 3 illustrates a voltage-current characteristic of a variable resistance memory device in accordance with an embodiment of the present disclosure.

FIG. 3 illustrates a voltage-current characteristic of a variable resistance memory device in accordance with an embodiment of the present disclosure.

A solid line 1 shown in FIG. 3 represents switch behavior of the variable resistance memory device in accordance with embodiments of the present disclosure. The switching behavior illustrated by the solid line 1 may be controlled by controlling the distribution density of oxygen vacancies embedded in an oxygen deficient region as described with reference to FIGS. 2A and 2B.

A dotted line 2 shown in FIG. 3 represents switching behavior of a variable resistance memory device based on controlling formation and the breakdown of a conducting filament (CF) through an electroforming process.

Referring to the solid line 1 and the dotted line 2, a change in resistance state of variable resistance memory devices in accordance with embodiments of the present disclosure is more gradual than that represented by the dotted line 2. Referring to the solid line 1 and the dotted line 2, a variable resistance memory device in accordance with an embodiment of the present disclosure can perform a switching operation with a relatively low current, as compared with the variable resistance memory devices represented by the dotted line 2.

As described above, because variable resistance memory devices in accordance with embodiments of the present disclosure are driven with low power, and because the change in resistance state is gradual, the variable resistance memory devices in accordance with embodiments of the present disclosure may be utilized into devices which require a gradual switching characteristic and low-power driving. In an embodiment, the variable resistance memory device may be applied to a neuromorphic device or a multi-bit level memory device.

Figure 4A:
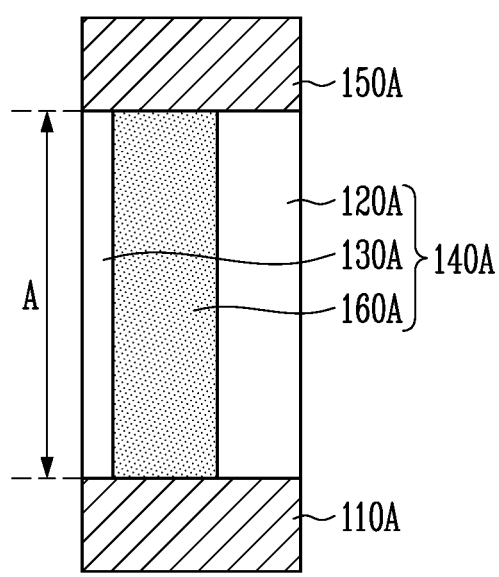
FIGS. 4A to 4C are sectional views illustrating variable resistance memory devices in accordance with embodiments of the present disclosure.
Figure 4B:
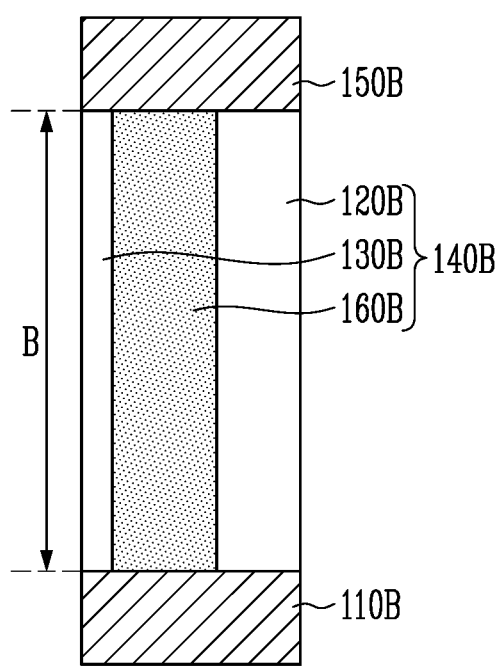
Figure 4C:
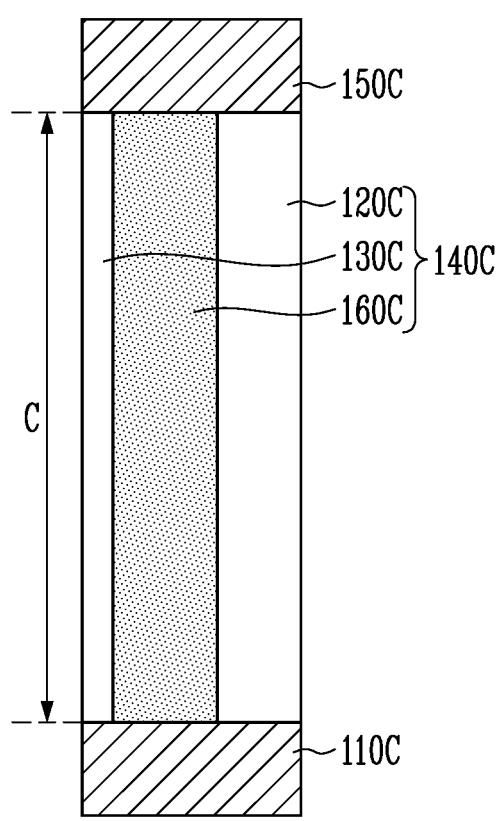

FIGS. 4A to 4C are sectional views illustrating variable resistance memory devices in accordance with embodiments of the present disclosure.

Referring to FIGS. 4A to 4C, oxide layers 140A, 140B, and 140C of the variable resistance memory devices may respectively include oxygen deficient regions 160A, 160B, and 160C, which are substantially similar to an oxygen deficient region 60 as described above and with reference to FIG. 1B. For example, each of the oxygen deficient regions 160A, 160B, and 160C may be defined by an oxidation-reduction reaction using a difference in oxygen affinity between a first layer and a second layer as described with reference to FIGS. 1A and 1B.

Each of the oxide layers 140A, 140B, and 140C may include respectively a first region 120A, 120B or 120C and a second region 130A, 130B or 130C, in addition to the oxygen deficient region 160A, 160B or 160C. The oxide layers 140A, 140B, and 140C are substantially the same as oxide layer 40 described above and with reference to FIG. 1B. For example, the oxygen deficient region 160A, 160B or 160C may be disposed between the first region 120A, 120B or 120C and the second region 130A, 130B or 130C. Each of the oxygen deficient region 160A, 160B or 160C, the first region 120A, 120B or 120C, and the second region 130A, 130B or 130C may extend in a vertical direction between a second electrode 150A, 150B or 150C and a first electrode 110A, 110B or 110C, respectively.

Lengths A, B, and C of the oxygen deficient regions 160A, 160B, and 160C, extending in the vertical direction, may vary. Resistances of the oxygen deficient regions 160A, 160B, and 160C increase as the lengths A, B, and C of the oxygen deficient regions 160A, 160B, and 160C increase.

Figure 5:
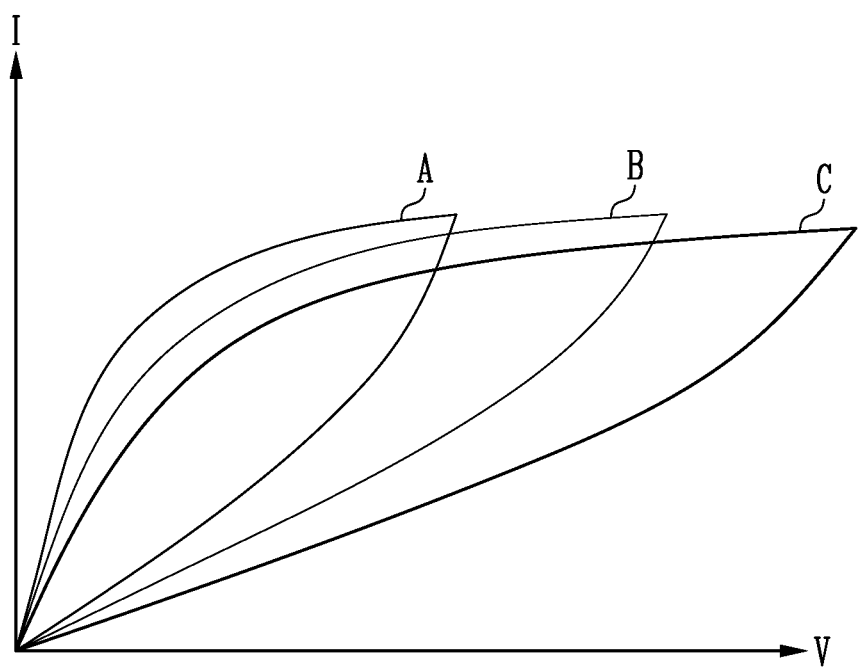
FIG. 5 illustrates voltage-current characteristics of variable resistance memory devices of FIGS. 4A to 4C.

FIG. 5 illustrates voltage-current characteristics of variable resistance memory devices of FIGS. 4A to 4C.

Referring to FIG. 5, switching behavior may differ according to the lengths A, B, and C of the oxygen deficient regions 160A, 160B, and 160C shown in FIGS. 4A to 4C. Specifically, the oxygen deficient region 160C having the length C, as shown in FIG. 4C, has an operable voltage range wider than that of the oxygen deficient region 160A having the length A and that of oxygen deficient region 160B having the length B when the length C is greater than the lengths A and B illustrated in FIGS. 4A and 4B. Similarly, the oxygen deficient region 160B having the length B has an operable voltage range wider than that of the oxygen deficient region 160A having the length A, which is shorter than the length B.

According to the above-described switching behavior, each of the variable resistance memory devices in accordance with the embodiments of the present disclosure can implement a larger number of different resistance states for each voltage period as the length of the oxygen deficient region increases. Thus, in the embodiments of the present disclosure, the length of the oxygen deficient region can be variously changed according to a number of resistance states to be implemented. In an embodiment, a length of an oxygen deficient region applied to a multi-bit level variable resistance memory device may be formed longer than that of an oxygen deficient region applied to a single-bit level variable resistance memory device.

Figure 6:
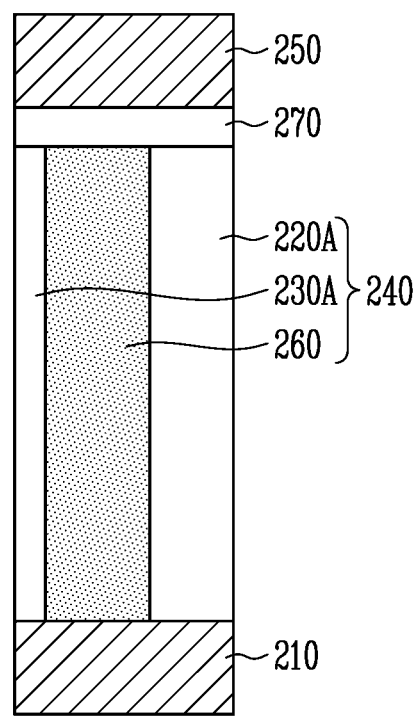
FIG. 6 is a sectional view illustrating a variable resistance memory device in accordance with an embodiment of the present disclosure.

FIG. 6 is a sectional view illustrating a variable resistance memory device in accordance with an embodiment of the present disclosure.

Referring to FIG. 6, an oxide layer 240 of a variable resistance memory device may include an oxygen deficient region 260, a first region 220A, and a second region 230A, similar to the oxide layer 40 with oxygen deficient region 60 as described above and with reference to FIG. 1B. For example, the oxygen deficient region 260 may be disposed between the first region 220A and the second region 230A. The oxygen deficient region 260 may be defined by an oxidation-reduction reaction using a difference in oxygen affinity between a first layer and a second layer as described with reference to FIGS. 1A and 1B. Each of the first region 220A, the second region 230A, and the oxygen deficient region 260 may extend toward a second electrode 250 from a first electrode 210.

The variable resistance memory device may further include a barrier layer 270. The barrier layer 270 may be disposed between the first electrode 210 and the oxide layer 240 or between the second electrode 250 and the oxide layer 240.

The barrier layer 270 may include an insulating material, and may prevent a transient current from flowing into the oxygen deficient region 260. In addition, a self-rectifying characteristic may be induced through the barrier layer 270.

The barrier layer 270 may include a chemically stable insulating material. In an embodiment, the barrier layer 270 may include silicon dioxide ($SiO_2$). A thickness of the barrier layer 270 may be formed in a range that allows the flow of current between the first electrode 210 and the second electrode 250. In an embodiment, the thickness of the barrier layer 270 may be 10 nm or less.

Figure 7:
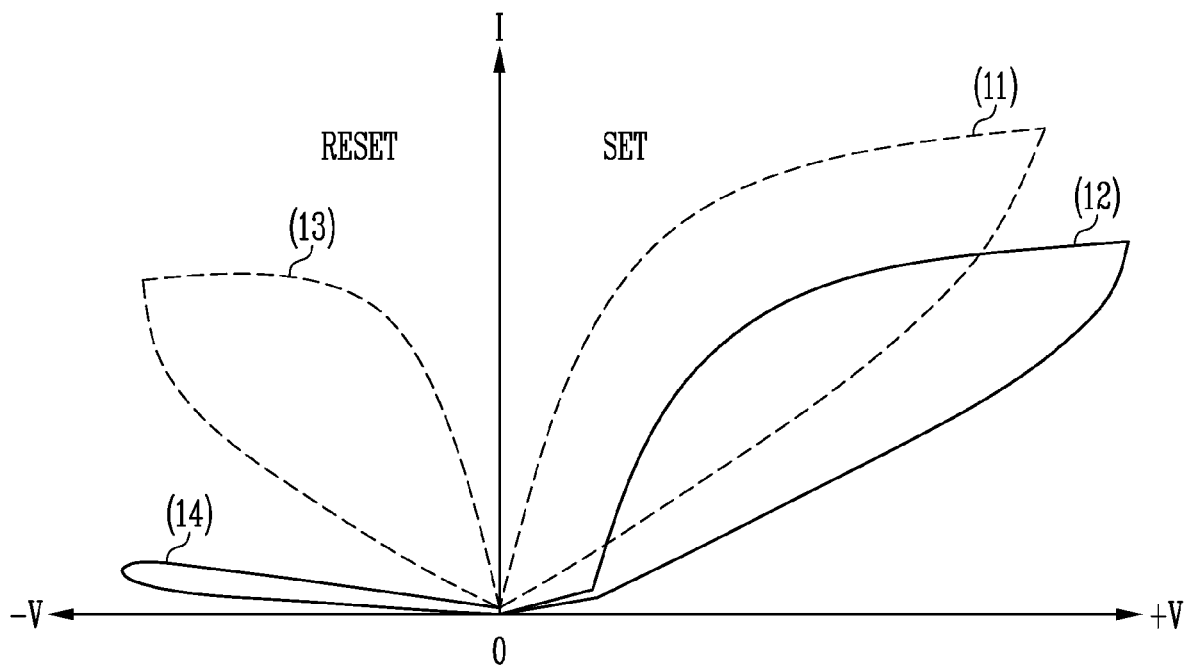
FIG. 7 illustrates voltage-current characteristics of variable resistance memory devices in accordance with embodiments of the present disclosure.

FIG. 7 illustrates voltage-current characteristics of variable resistance memory devices in accordance with embodiments of the present disclosure.

Dotted lines 11 and 13 shown in FIG. 7 represent switching behavior of a variable resistance memory device which does not include any barrier layer but includes an oxygen deficient region in which oxygen vacancies are embedded. Solid lines 12 and 14 shown in FIG. 7 represent switching behavior of a variable resistance memory device which includes a barrier layer and an oxygen deficient region in which oxygen vacancies are embedded. In other words, the dotted lines 11 and 13 represent voltage-current characteristics of a set state and a reset state of a variable resistance memory device described with reference to FIG. 1B, and the solid lines 12 and 14 represent voltage-current characteristics of a set state and a reset state of a variable resistance memory device described with reference to FIG. 6.

Referring to FIG. 7, according to the solid lines 12 and 14 representing the switching behavior of the variable resistance memory device including the barrier layer, and the dotted lines 11 and 13 representing the switching behavior of the variable resistance memory device not including a barrier layer, it can be seen that the variable resistance memory device including the barrier layer operates with a relatively lower current. In addition, when the barrier layer is included, a current is maintained at a low level when a voltage for the reset state is applied, as shown by the solid line 14. That is, it can be seen that a self-rectifying characteristic is induced when a barrier layer is included in a variable resistance memory device.

Figure 8A:
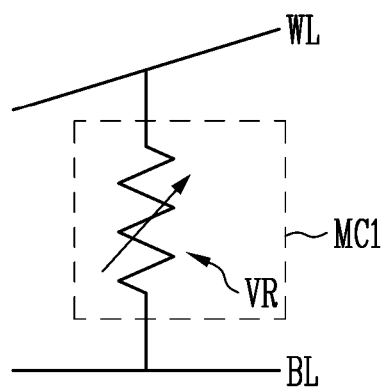
FIGS. 8A and 8B are views illustrating a cross point array in accordance with an embodiment of the present disclosure.
Figure 8B:
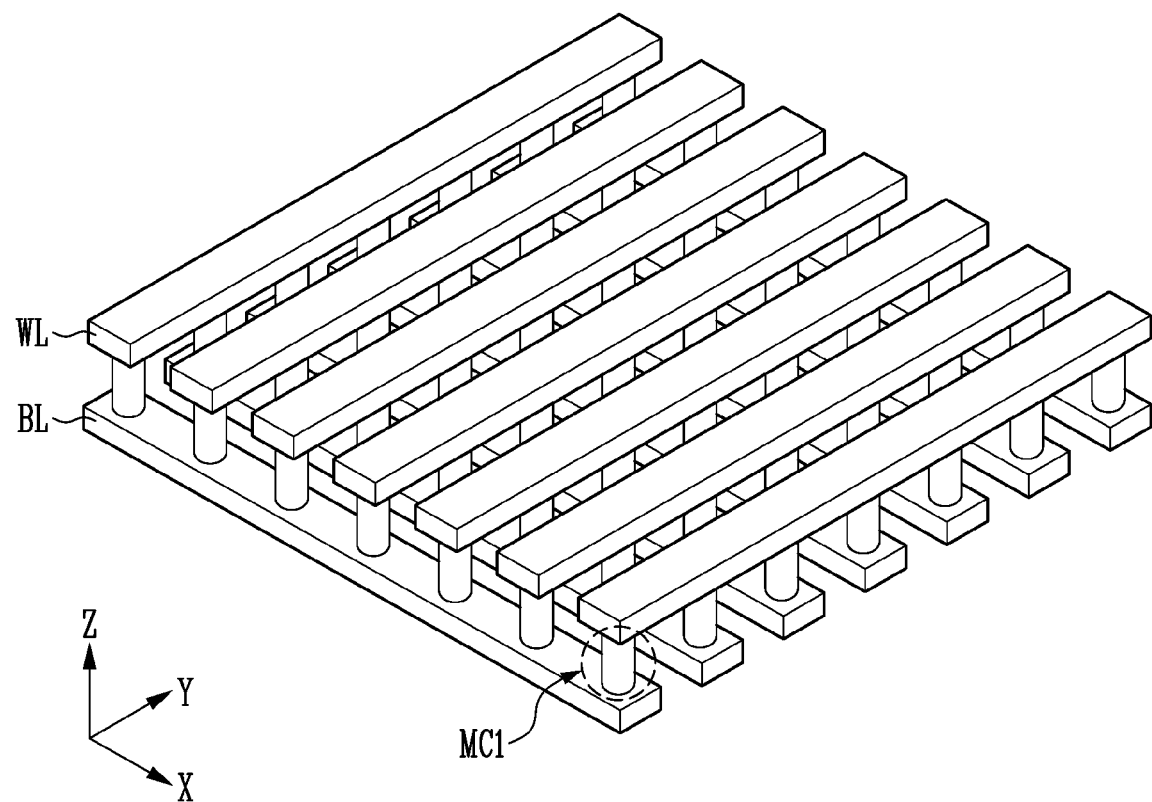

FIGS. 8A and 8B are views illustrating a cross point array in accordance with an embodiment of the present disclosure.

Referring to FIGS. 8A and 8B, a cross point array may include a first line BL and a second line WL, which intersect each other. The first line BL may be used as a first electrode, and the second line WL may be used as a second electrode.

A memory cell MC1 may be disposed at an intersection portion of, or an area between, the first line BL and the second line WL.

The memory cell MC1 may include a variable resistance device VR connected to the first line BL and the second line WL as shown in FIG. 8A.

Figure 9A:
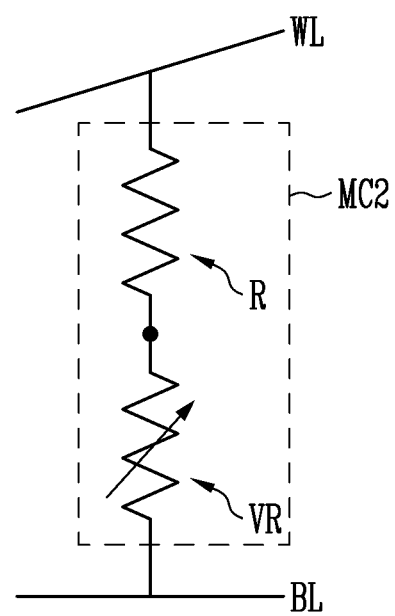
FIGS. 9A and 9B are views illustrating a cross point array in accordance with an embodiment of the present disclosure.
Figure 9B:
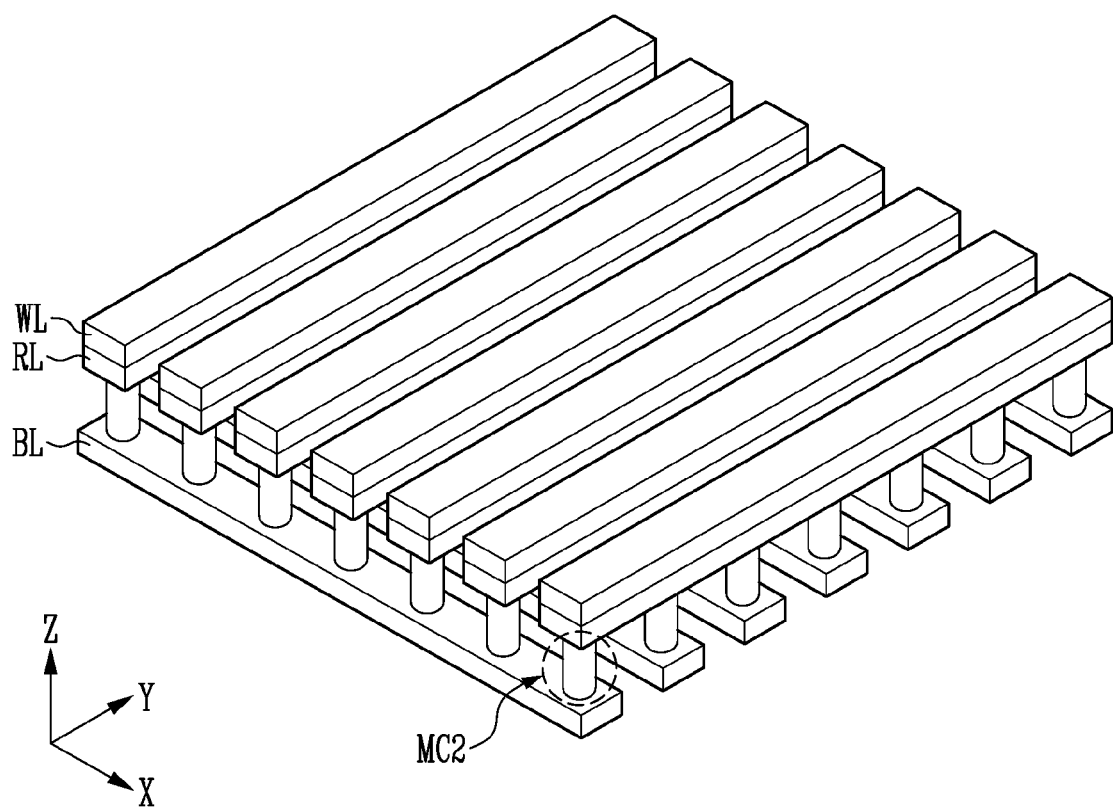

FIGS. 9A and 9B are views illustrating a cross point array in accordance with an embodiment of the present disclosure.

Referring to FIGS. 9A and 9B, similar to a cross point array described in FIGS. 8A and 8B, a cross point array may include a first line BL and a second line WL, which intersect each other. A memory cell MC2 may be disposed at an intersection portion of, or areas between, the first line BL and the second line WL.

As shown in FIG. 9A, the memory cell MC2 may include a variable resistance device VR connected to the first line BL and a resistance device R connected in series between the variable resistance device VR and the second line WL.

Referring to FIG. 9B, the resistance device R shown in FIG. 9A may be implemented through a barrier layer RL disposed between the memory cell MC2 and the second line WL. The barrier layer RL may extend along the second line WL. The barrier layer RL may include silicon dioxide ($SiO_2$), similar to a barrier layer 270 as described above with reference to FIG. 6, and may be formed with a thickness of 10 nm or less.

Figure 10A:
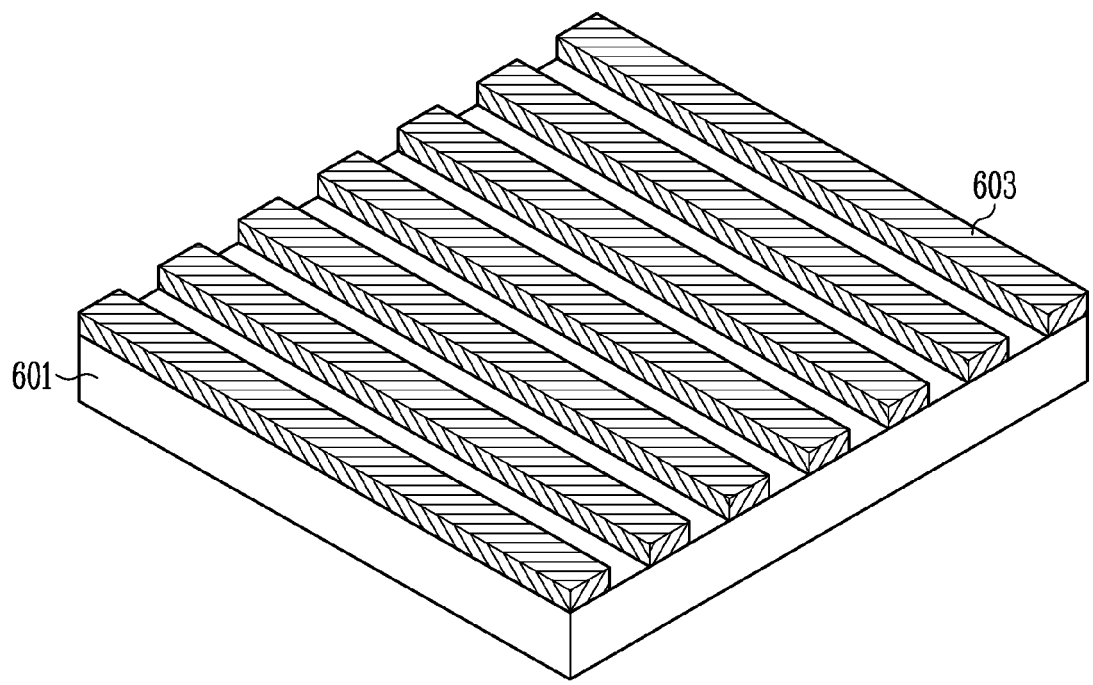
FIGS. 10A and 10B are views illustrating part of a manufacturing method of a cross point array in accordance with an embodiment of the present disclosure.
Figure 10B:
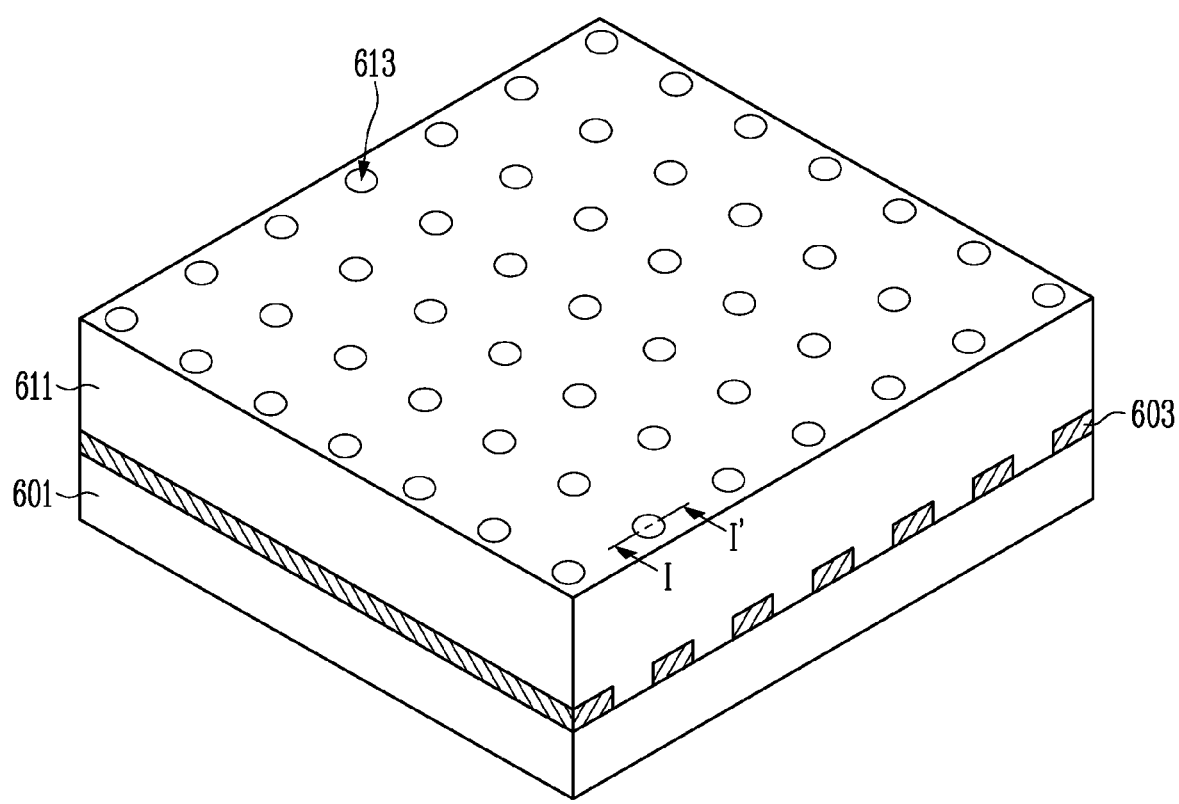

FIGS. 10A and 10B are views illustrating a part of a manufacturing method of a cross point array in accordance with an embodiment of the present disclosure.

Referring to FIG. 10A, first lines 603 may be formed on a base structure 601. The base structure 601 may include a substrate covered with an insulating layer. The first lines 603 may extend in parallel to each other. Each of the lines 603 may be used as a first electrode.

Referring to FIG. 10B, an insulating layer 611 may be formed to cover the first lines 603. The insulating layer 611 may fill spaces between the first lines 603.

The insulating layer 611 may include a chemically stable material. In an embodiment, the insulating layer 611 may include silicon dioxide ($SiO_2$).

Subsequently, memory holes 613 may be formed to penetrate the insulating layer 611. The memory holes 613 may overlap with the first lines 603 in a vertical direction.

Subsequently, memory cells may be formed in the memory holes 613 and on the first lines 603.

Hereinafter, methods of forming memory cells in accordance with various embodiments of the present disclosure will be described with reference to sectional views taken along line I-I' of FIG. 10B.

FIGS. 11A to 11D are sectional views illustrating a method of forming a memory cell in accordance with an embodiment of the present disclosure. FIGS. 11A to 11D are sectional views, illustrating manufacturing processes, taken along the line I-I' shown in FIG. 10B.

Referring to FIG. 11A, the memory hole 613 may penetrate the insulating layer 611, and overlap with the first line 603, which is disposed on the base structure 601. The first line 603 may be exposed by the memory hole 613.

Referring to FIG. 11B, a first layer 620 may be formed on a sidewall of the memory hole 613. Subsequently, a second layer 630 may be formed on a sidewall of the first layer 620. Each of the first layer 620 and the second layer 630 may extend in a vertical direction intersecting a surface of the first line 603. More specifically, each of the first layer 620 and the second layer 630 may extend along the sidewall of the memory hole 613. A central region of the memory hole 613 is left open and is not filled by the first layer 620 or by the second layer 630.

The first layer 620 and the second layer 630 may be respectively formed as material layers having different oxygen affinities. In an embodiment, the second layer 630 may include a material having an oxygen affinity higher than that of the first layer 620.

In an embodiment, the first layer 620 may include a first transition metal oxide. The second layer 630 may include aluminum, silicon or a second transition metal oxide. The second transition metal oxide may include a transition metal having an oxidation rate higher than that of the first transition metal oxide. More specifically, the first layer 620 may include hafnium oxide (HfO$_x$), and the second layer 630 may include silicon.

Referring to FIG. 11C, similar to structures as described with reference to FIG. 1B, an oxide layer 690A including an oxygen deficient region 660A may be formed by using an oxidation-reduction reaction. In an embodiment, the oxide layer 690A may include the oxygen deficient region 660A, and a first region 620A and a second region 630A, which are disposed at opposite sides of the oxygen deficient region 660A.

The first region 620A may be a portion of the first layer 620 shown in FIG. 11B. The second region 630A may be oxidizing material of the second layer 630 shown in FIG. 11B, or may be substantially similar to a portion of the second layer 630 shown in FIG. 11B. In an embodiment, the first region 620A may include a first transition metal oxide, and the second region 630A may include aluminum oxide, silicon oxide, or a second transition metal oxide. More specifically, when the first layer 620 shown in FIG. 11B includes hafnium oxide (HfOx) and the second layer 630 includes silicon, a mixture (Si:HfOx) of silicon and hafnium oxide may be generated in the oxygen deficient region 660A. In addition, the first region 620A may include remaining hafnium oxide (HfOx), and the second region 630A may include silicon oxide (SiOx).

Referring to FIG. 11D, the central region of the memory hole 613 shown in FIG. 11C may be filled with a core insulating layer 695. The core insulating layer 695 may include a chemically stable material. In an embodiment, the core insulating layer 695 may include silicon dioxide (SiO$_2$).

A memory cell including the oxygen deficient region 660A may be formed through the processes described with reference to FIGS. 11A to 11D.

FIG. 12 is a perspective view illustrating a memory cell shown in FIG. 11D.

Referring to FIG. 12, a memory cell may include a core insulating layer 695 and an oxide layer 690A surrounding the core insulating layer 695. The oxide layer 690A may include an oxygen deficient region 660A including oxygen vacancies, and the oxygen deficient region 660A may surround a sidewall of the core insulating layer 695. A first region 620A of the oxide layer 690A may surround the oxygen deficient region 660A, and a second region 630A of the oxide layer 690A may be disposed between the core insulating layer 695 and the oxygen deficient region 660A.

The structure of the memory cell shown in FIG. 12 may fill the memory hole 613 shown in FIG. 10B. The structure of the memory cell shown in FIG. 12 may be applied to a memory cell MC1 shown in FIG. 8B or a memory cell MC2 shown in FIG. 9B.

FIGS. 13A and 13B are sectional views illustrating a method of forming a memory cell in accordance with an embodiment of the present disclosure.

Referring to FIG. 13A, a memory hole 613 may be provided by the processes described with reference to FIGS. 10A and 10B. The memory hole 613 may penetrate the insulating layer 611 and overlap with the first line 603 on the base structure 601. Subsequently, a first layer 621[1], a second layer 631, and a third layer 621[2] may be sequentially formed on a sidewall of the memory hole 613.

Each of the first layer 621[1], the second layer 631, and the third layer 621[2] may extend in a vertical direction intersecting a surface of the first line 603 and may extend along the sidewall of the memory hole 613. A central region of the memory hole 613 is open and not filled by the first layer 621[1], the second layer 631, or the third layer 621[2].

The first layer 621[1] and the third layer 621[2] may be formed of the same material. The second layer 631 may be made of materials having an oxygen affinity different from those of the first layer 621[1] and the third layer 621[2]. In an embodiment, each of the first layer 621[1] and the third layer 621[2] may be made of a material having an oxygen affinity higher than that of the second layer 631. In an embodiment, the second layer 631 may include a first transition metal oxide. Each of the first layer 621[1] and the third layer 621[2] may include aluminum, silicon or a second transition metal oxide. The second transition metal oxide may include a transition metal having an oxidation rate higher than that of the first transition metal oxide. More specifically, each of the first layer 621[1] and the third layer 621[2] may include silicon, and the second layer 631 may include hafnium oxide (HfO$_x$).

Referring to FIG. 13B, an oxidation-reduction reaction may occur due to a difference in oxygen affinity between the first layer 621[1] and the second layer 631, which are shown in FIG. 13A, and a difference in oxygen affinity between the second layer 631 and the third layer 621[2], which are shown in FIG. 13A. The oxidation-reduction reaction may occur from an interface between the first layer 621[1] and the second layer 631, and from an interface between the second layer 631 and the third layer 621[2] according to the same principles as described with reference to FIG. 1B. Accordingly, an oxide layer 690B including a first oxygen deficient region 660B1 and a second oxygen deficient region 660B2 may be formed. Also, the oxide layer 690B may include a first region 621A1 and a second region 631A, which are disposed at both sides of the first oxygen deficient region 66061, and a third region 621A2 disposed at one side of the second oxygen deficient region 660B2.

The first region 621A1 and the third region 621A2 may be respectively configured with portions of the first layer 621[1] and the third layer 621[2], which are shown in FIG. 13A, or be respectively configured with oxidizing materials of the first layer 621[1] and the third layer 621[2]. For example, the second region 631A may be configured as a portion of the second layer 631 shown in FIG. 13A. In an embodiment, the second region 631A may include a first transition metal oxide, and each of the first region 621A1 and the third region 621A2 may include aluminum oxide, silicon oxide, or a second transition metal oxide. More specifically, when the second layer 631 shown in FIG. 13A incudes hafnium oxide (HfOx), and the first and third layers 621[1] and 621[2] shown in FIG. 13A include silicon, each of the first oxygen deficient region 660B1 and the second oxygen deficient region 660B2 may include a mixture (Si:HfOx) of silicon and hafnium oxide. In addition, remaining hafnium oxide (HfOx) may constitute the second region 631A, and each of the first region 621A1 and the third region 621A2 may include silicon oxide (SiOx).

Subsequently, the central region of the memory hole 613 shown in FIG. 13A may be filled with the core insulting layer 695. The core insulating layer 695 may include silicon dioxide (SiO$_2$) as described with reference to FIG. 11D.

A memory cell including the first oxygen deficient region 660B1 and the second oxygen deficient region 660B2 may be formed through the processes described with reference to FIGS. 13A and 13B.

FIG. 14 is a perspective view illustrating a memory cell shown in FIG. 13B.

Referring to FIG. 14, a memory cell may include the core insulating layer 695 and the oxide layer 690B surrounding the sidewall of the core insulating layer 695.

The oxide layer 690B may include the first oxygen deficient region 660B1 and the second oxygen deficient region 660B2, which include oxygen vacancies and are spaced apart from each other. The first oxygen deficient region 660B1 may surround the sidewall of the core insulating layer 695. The second oxygen deficient region 660B2 may be disposed between the first oxygen deficient region 660B1 and the core insulating layer 695.

The first region 621A1 of the oxide layer 690B may surround the first oxygen deficient region 66061. The second region 631A of the oxide layer 690B may be disposed between the first oxygen deficient region 660B1 and the second oxygen deficient region 660B2. The third region 621A2 of the oxide layer 690B may be disposed between the core insulating layer 695 and the second oxygen deficient region 660B2.

The structure of the memory cell shown in FIG. 14 may fill the memory hole 613 shown in FIG. 10B. The structure of the memory cell shown in FIG. 14 may be applied to a memory cell MC1 shown in FIG. 8B or a memory cell MC2 shown in FIG. 9B.

FIGS. 15A and 15B are sectional views illustrating a method of forming a memory cell in accordance with an embodiment of the present disclosure.

Referring to FIG. 15A, a memory hole 613 may be provided through the processes described with reference to FIGS. 10A and 10B. A memory hole 613 may penetrate an insulating layer 611 and may overlap with a first line 603 on a base structure 601. Subsequently, a first layer 621'[1], a second layer 631, and a third layer 621'[2], which are made of the same materials as the first layer 621[1], the second layer 631, and the third layer 621[2] shown in FIG. 13A, may be sequentially formed on a sidewall of the memory hole 613. However, the second layer 631' may be formed with a width narrower, or with a smaller thickness, than that of the second layer 631 shown in FIG. 13A. Each of the first layer 621'[1], the second layer 631, and the third layer 621'[2] may extend in the vertical direction intersecting the surface of the first line 603 and may extend along the sidewall of the memory hole 613. A central region of the memory hole 613 is not filled by the first layer 621'[1], the second layer 631', or the third layer 621'[2], but may instead remain open.

Referring to FIG. 15B, an oxidation-reduction reaction may occur due to a difference in oxygen affinity between the first layer 621'[1] and the second layer 631, which are shown in FIG. 15A, and a difference in oxygen affinity between the second layer 631' and the third layer 621'[2], which are shown in FIG. 15A. The oxidation-reduction reaction may occur from an interface between the first layer 621'[1] and the second layer 631', which are shown in FIG. 15A, and another oxidation-reduction reaction may occur from an interface between the second layer 631' and the third layer 621'[2], by the same principles as described above with reference to FIG. 1B. The oxidation-reduction reactions may be controlled such that the whole of the second layer 631' illustrated in FIG. 15A is reduced. Accordingly, an oxide layer 690C including an oxygen deficient region 660C may be formed. Also, the oxide layer 690C may include a first region 621'A1 and a second region 621'A2, which are disposed at both sides of the oxygen deficient region 660C.

The first region 621'A1 and the second region 621'A2 may be respectively configured with portions of the first layer 621'[1] and the third layer 621'[2], which are shown in FIG. 15A, or be respectively configured with oxidizing materials of the first layer 621'[1] and the third layer 621'[2] illustrated in FIG. 15A. In an embodiment, each of the first region 621'A1 and the second region 621'A2 may include aluminum oxide, silicon oxide, or transition metal oxide. More specifically, when the second layer 631' shown in FIG. 15A includes hafnium oxide (HfO$_x$), and the first layer 621'[1] and the second layer 621'[2] include silicon, the oxygen deficient region 660C may include a mixture (Si:HfO$_x$) of silicon and hafnium oxide. In addition, each of the first region 621'A1 and the second region 621'A2 may include silicon oxide (SiO$_x$).

Subsequently, the central region of the memory hole 613 shown in FIG. 15A may be filled with a core insulating layer 695. The core insulating layer 695 may include silicon dioxide (SiO$_2$).

A memory cell including the oxygen deficient region 660C may be formed through the processes described with reference to FIGS. 15A and 15B.

FIG. 16 is a perspective view illustrating a memory cell shown in FIG. 15B.

Referring to FIG. 16, a memory cell may include the core insulating layer 695 and the oxide layer 690C surrounding the sidewall of the core insulating layer 695. The oxide layer 690C may include oxygen deficient region 660C including oxygen vacancies, and the oxygen deficient region 660C may surround the sidewall of the core insulating layer 695. The first region 621'A1 of the oxide layer 690C may surround the oxygen deficient region 660C, and the second region 621'A2 may be disposed between the core insulating layer 695 and the oxygen deficient region 660C.

The structure of the memory cell shown in FIG. 16 may fill the memory hole 613 shown in FIG. 10B. The structure of the memory cell shown in FIG. 16 may be applied to a memory cell MC1 shown in FIG. 8B or a memory cell MC2 shown in FIG. 9B.

FIGS. 17 and 18 are views illustrating processes performed after a memory cell is formed according to embodiments of the disclosure.

Referring to FIGS. 17 and 18, first lines 603 may be formed on a base structure 601 by using the processes described with reference to FIGS. 10A and 10B. The first lines 603 may be covered by an insulating layer 611.

Subsequently, in order to form a memory cell including an oxygen deficient region, the processes described with reference to FIGS. 11A to 11D may be performed, the processes described with reference to FIGS. 13A and 13B may be performed, or the processes described with reference to FIGS. 15A and 15B may be performed. Accordingly, a memory cell, which penetrates the insulating layer 611 and overlaps with each of the first lines 603, is formed to include at least one oxygen deficient region as shown in FIG. 12, 14 or 16.

Referring to FIG. 17, second lines 705A may be formed on the insulating layer 611, which is penetrated by memory cells with a structure shown in FIG. 12, 14 or 16. The longitudinal direction of second lines 705A may intersect the longitudinal direction of first line 603. Thus, in areas of intersection, each of the second lines 705A may overlap with the memory cell shown in FIG. 12, 14 or 16 in a vertical direction. Each of the second lines 705A may be used as a second electrode.

Referring to FIG. 18, after a barrier layer 701 and a conductive layer are stacked on the insulating layer 611, which is penetrated by the memory cells with structures shown in FIG. 12, 14 or 16, second lines 705B may be formed by etching the conductive layer. The longitudinal direction of second lines 705B may intersect the longitudinal direction of first lines 603. In areas of intersection, each of the second lines 705B may overlap with the memory cell shown in FIG. 12, 14 or 16 in a vertical direction.

The barrier layer 701 may be patterned in a shape substantially the same as that of the second line 705B. The barrier layer 701 may be disposed between the second lines 705B and the insulating layer 611 and may be in contact with the second lines 705B. The barrier layer 701 may include silicon dioxide ($SiO_2$), as described with reference to FIG. 6, and be formed with a thickness of 10 nm or less.

FIG. 19 is a block diagram illustrating a configuration of a memory system in accordance with an embodiment of the present disclosure.

Referring to FIG. 19, the memory system 1100 includes a memory device 1112 and a memory controller 1111.

The memory device 1112 may be a multi-chip package configured with a plurality of memory chips. The memory chips may be divided into a plurality of groups. The plurality of groups may communicate with the memory controller 1111 respectively through first to kth channels CH1 to CHk (where k is an integer).

Each of the memory chips may include a variable resistance memory device. The variable resistance memory device may include a first electrode, a second electrode above the first electrode, and an oxide layer having an oxygen deficient region distributed in a vertical direction facing the second electrode from the first electrode.

The memory controller 1111 accesses the memory device 1112 in response to a request from a host Host. For example, the memory controller 1111 controls a set operation and a reset operation of the memory device 1112, and a background operation. The memory controller 1111 may control the memory device 1112 through the plurality of channels CH1 to CHk.

FIG. 20 is a block diagram illustrating a configuration of a computing system in accordance with an embodiment of the present disclosure.

Referring to FIG. 20, a computing system 1200 may include a central processing unit (CPU) 1220, a random access memory (RAM) 1230, a user interface 1240, a modem 1250, and a memory system 1210, which are electrically connected to a system bus 1260. The computing system 1200 may be a mobile device.

The memory system 1210 may be configured with a memory device 1212 and a memory controller 1211. The memory device 1212 may be configured as a variable resistance memory device including a first electrode, a second electrode above the first electrode, and an oxide layer having an oxygen deficient region distributed in a vertical direction facing the second electrode from the first electrode.

In accordance with the embodiments of the present disclosure, the distribution density of oxygen vacancies in an oxygen deficient layer is controlled, so that an operation of the memory cell can be controlled.

In accordance with the present disclosure, an oxygen deficient region including oxygen vacancies is formed in an oxide layer, and the distribution density of the oxygen vacancies is controlled, so that a resistance state of the memory cell can be changed.

In accordance with the present disclosure, because the oxygen vacancies are generated in a manufacturing process of the variable resistance memory device, the oxygen deficient region can be defined in the oxide layer. Accordingly, the distribution density of the oxygen vacancies can be controlled without an electroforming process for generating the oxygen vacancies during an operation of the variable resistance memory device. Thus, the operational stability of the variable resistance memory device can be improved.

In accordance with the present disclosure, the oxygen vacancies can be uniformly distributed in a vertical direction facing a second electrode from a first electrode, so that a conductive path between the first electrode and the second electrode can be easily formed.

What is claimed is:

1. A variable resistance memory device comprising:
a first electrode;
a second electrode arranged in a vertical direction from the first electrode; and
a memory cell disposed between the first electrode and the second electrode, the memory cell having a varying resistance according to a distribution density of oxygen vacancies in the memory cell,
wherein the memory cell includes an oxide layer having a first oxygen deficient region extending in the vertical direction between the second electrode and the first electrode,
wherein the distribution density of the oxygen vacancies in the memory cell is disposed in the first oxygen deficient region, and
wherein the oxide layer further includes a first region and a second region that extend in the vertical direction from a top of the first electrode, the first oxygen deficient region disposed between the first region and the second region.

2. The variable resistance memory device of claim 1, further comprising a core insulating layer disposed between the first electrode and the second electrode,
wherein the oxide layer surrounds a sidewall of the core insulating layer.

3. A variable resistance memory device comprising:
a first electrode;
a second electrode arranged in a vertical direction from the first electrode;
a memory cell disposed between the first electrode and the second electrode, the memory cell having a varying resistance according to a distribution density of oxygen vacancies in the memory cell, wherein the memory cell includes an oxide layer having a first oxygen deficient region extending in the vertical direction between the second electrode and the first electrode, and wherein the distribution density of the oxygen vacancies in the memory cell is disposed in the first oxygen deficient region; and
a core insulating layer disposed between the first electrode and the second electrode, wherein the oxide layer surrounds a sidewall of the core insulating layer,
wherein the oxide layer further includes:
a first region surrounding the first oxygen deficient region; and
a second region disposed between the core insulating layer and the first oxygen deficient region.

4. The variable resistance memory device of claim 3, wherein the first region includes a first transition metal oxide, and
the second region includes aluminum oxide, silicon oxide, or a second transition metal oxide having an oxygen affinity higher than that of the first transition metal oxide.

5. The variable resistance memory device of claim 3, wherein the first region includes hafnium oxide, and
the second region includes silicon oxide, and
wherein the first oxygen deficient region includes a mixture (Si:HfOx) of silicon and hafnium oxide.

6. The variable resistance memory device of claim 3, wherein each of the first region and the second region includes transition metal oxide, silicon oxide, or aluminum oxide.

7. The variable resistance memory device of claim 3, wherein each of first region and the second region includes silicon oxide, and
wherein the first oxygen deficient region includes a mixture (Si:HfOx) of silicon and hafnium oxide.

8. A variable resistance memory device comprising:
a first electrode;
a second electrode arranged in a vertical direction from the first electrode;
a memory cell disposed between the first electrode and the second electrode, the memory cell having a varying resistance according to a distribution density of oxygen vacancies in the memory cell, wherein the memory cell includes an oxide layer having a first oxygen deficient region extending in the vertical direction between the second electrode and the first electrode, and wherein the distribution density of the oxygen vacancies in the memory cell is disposed in the first oxygen deficient region; and
a core insulating layer disposed between the first electrode and the second electrode, wherein the oxide layer surrounds a sidewall of the core insulating layer,
wherein the oxide layer further includes:
a second oxygen deficient region disposed between the first oxygen deficient region and the core insulating layer;
a first region surrounding the first oxygen deficient region;
a second region between the first oxygen deficient region and the second oxygen deficient region; and
a third region between the core insulating layer and the second oxygen deficient region.

9. The variable resistance memory device of claim 8, wherein the second region includes a first transition metal oxide, and
each of the first region and the third region includes aluminum oxide, silicon oxide, or a second transition metal oxide having an oxygen affinity higher than that of the first transition metal oxide.

10. The variable resistance memory device of claim 8, wherein the second region includes hafnium oxide, and
each of the first region and the third region includes silicon oxide, and
wherein each of the first oxygen deficient region and the second oxygen deficient region includes a mixture (Si:HfOx) of silicon and hafnium oxide.

11. The variable resistance memory device of claim 1, further comprising a barrier layer formed between any one of the first electrode and the second electrode and the memory cell.

12. The variable resistance memory device of claim 1, wherein the first electrode and the second electrode extend in directions that intersecting each other and that form a plane perpendicular to the vertical direction.

* * * * *